(12) United States Patent
Nedovic et al.

(10) Patent No.: US 9,413,389 B2
(45) Date of Patent: Aug. 9, 2016

(54) AUTOMATIC SYNCHRONIZATION OF A TRANSMITTER

(75) Inventors: Nikola Nedovic, San Jose, CA (US); Shuo-Chun Kao, Sunnyvale, CA (US)

(73) Assignee: Fujitsu Limited, Kawasaki-shi (JP)

( * ) Notice: Subject to any disclaimer, the term of this patent is extended or adjusted under 35 U.S.C. 154(b) by 764 days.

(21) Appl. No.: 13/355,202

(22) Filed: Jan. 20, 2012

(65) Prior Publication Data

US 2013/0188657 A1   Jul. 25, 2013

(51) Int. Cl.
*H03M 9/00* (2006.01)
*H04J 3/06* (2006.01)

(52) U.S. Cl.
CPC ............... *H03M 9/00* (2013.01); *H04J 3/0685* (2013.01)

(58) Field of Classification Search
None
See application file for complete search history.

(56) References Cited

U.S. PATENT DOCUMENTS

2006/0188051 A1* 8/2006 Donnelly et al. ............. 375/371
2011/0242963 A1* 10/2011 Dapper et al. ................ 370/210

* cited by examiner

*Primary Examiner* — Hassan Phillips
*Assistant Examiner* — Omeed D Rahgozar
(74) *Attorney, Agent, or Firm* — Baker Botts L.L.P.

(57) ABSTRACT

An electronic device includes a transmission module communicatively coupled to a synchronizer. The transmission module is configured to transform received data for transmission, receive a first instruction from the synchronizer, based on the instruction adjust the phase of a clock signal used to time the transformation of the received data, and send the adjusted clock signal to the synchronizer. The synchronizer is configured to receive the adjusted clock signal, receive a data signal comprising a frequency and a phase of data to be transmitted, based on the adjusted clock signal and the data signal, determine a second instruction for the transmission module, and provide the second instruction to the transmission module.

22 Claims, 8 Drawing Sheets

AUTOMATIC SYNCHRONIZATION OF A TRANSMITTER

TECHNICAL FIELD OF THE INVENTION

The present invention relates generally to electronic communications and, more particularly, to automatic synchronization of a transmitter.

BACKGROUND

In electronic communications, a data serializer may be used to send data from one electronic device to another by converting a structure of data to a stream of information to be passed over a data link. The structure of data may include a relatively large number of data bits to transmit a data in a parallel fashion, where the structure is transmitted all at once. The serializer may convert the structure of data into a narrower transmission bus containing relatively few data bits, for transmission in a serial fashion. Thus the structure may be transmitted in pieces. The narrower transmission bus may operate at a higher frequency than a bus transmitting the entire data structure. For example, a serializer may receive data from an internal data bus transmitting at a first frequency, divide the data into pieces, and transmit the pieces one by one over the transmission bus.

SUMMARY

In one embodiment, an electronic device includes a transmission module communicatively coupled to a synchronizer. The transmission module is configured to transform received data for transmission, receive a first instruction from the synchronizer, based on the instruction adjust the phase of a clock signal used to time the transformation of the received data, and send the adjusted clock signal to the synchronizer. The synchronizer is configured to receive the adjusted clock signal, receive a data signal comprising a frequency and a phase of data to be transmitted, based on the adjusted clock signal and the data signal, determine a second instruction for the transmission module, and provide the second instruction to the transmission module.

In another embodiment, a method of dividing the frequency of a signal includes receiving an input clock signal, dividing the frequency of the clock signal, receiving a phase selector signal, adjusting the phase of the divided clock signal to generate two or more phase-adjusted divided clock signals, and, based upon the phase selector signal, selecting and outputting one of the phase-adjusted divided clock signals to a component for transforming data in a data transmission module.

In yet another embodiment, a method of transmitting data includes receiving data for transmission, receiving a first instruction from a synchronizer, based on the instruction, adjusting the phase of a clock signal used to time the transformation of the received data, and sending the adjusted clock signal to the synchronizer.

In still yet another embodiment, a method of synchronizing the transmitting of data includes receiving a divided clock signal from a transmission module, receiving a data signal comprising a frequency and a phase of data to be transmitted, based on the divided clock signal and the data signal, determine an instruction for the transmission module, and provide the instruction to the transmission module. The instruction includes information associated with adjusting the phase of the divided clock signal. The divided clock signal is configured to time transformation of data.

BRIEF DESCRIPTION OF THE DRAWINGS

For a more complete understanding of the present invention and its features and advantages, reference is now made to the following description, taken in conjunction with the accompanying drawings, in which.

DETAILED DESCRIPTION

Figure 1:
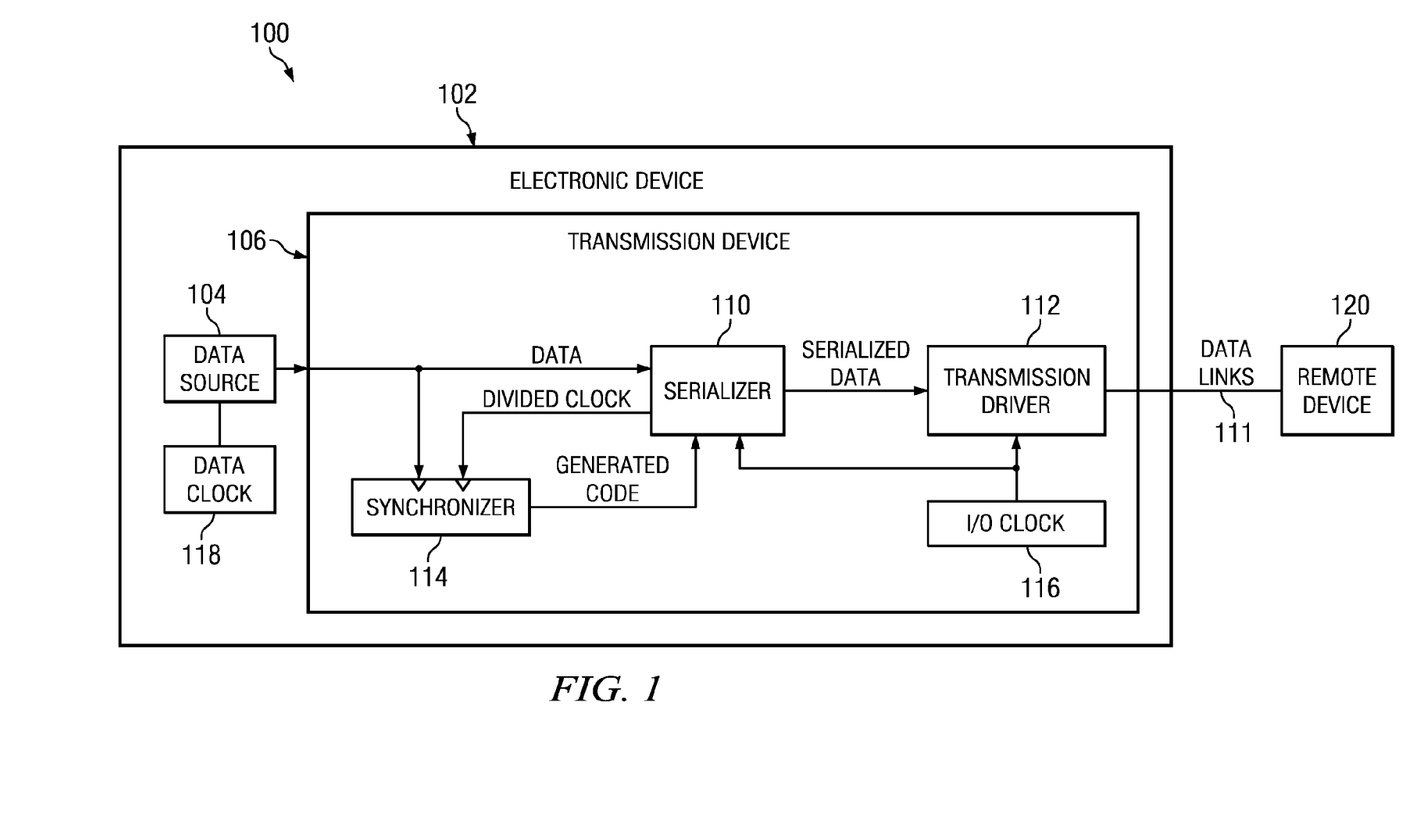
FIG. 1 is an example embodiment of a system with automatic synchronization of a transmitter.

FIG. 1 is an example embodiment of a system 100 with automatic synchronization of an input-output transmitter. System 100 may include an electronic device 102 communicatively coupled to another electronic device such as remote device 120 via a link such as data link 111. Electronic device 104 may be configured to transmit data from a data source 104 to remote device 120 using, for example, transmission device 106. Transmission device 106 may include automatic synchronization for inputting and/or outputting data.

Although an example embodiment of transmission device 106 is shown, transmission device 106 may include more or less components. Further, in various embodiments transmission device 106 may not be implemented as a single, unitary device. In such embodiments, various portions of transmission device 106 may reside in different portions of electronic device 102.

Transmission device 106 may include any suitable mechanism for sending data from a data source 104 over data link 111. Transmission device 106 may receive data from data source 104 over an internal bus with a width wider than data link 111. Transmission device 106 may be configured to send data from data source 104 over data link 111 at a rate sufficient to match the rate at which data from data source 104 is received. In one embodiment, transmission device 106 may include a serializer 110 configured to transform a portion of data from data source 104. Data source 104 may provide a number of input bits to be provided to serializer 110, which may serialize the input bits into a series. Serializer 110 may be implemented by any suitable component, chip, circuit, or other mechanism. Serializer 110 may be configured to send data received from data source 104 serially over data link 111. The rate that data is transmitted over data link 111 may depend upon, for example, the amount of data received, the size of the serialized units, the width of the bus carrying data from data source 104, or the rate at which such data from data source 104 is arriving at transmission device 106. Serializer 110 may be configured to use First-In-First-Out ("FIFO") data structures such as queues to transmit information over data link 111. Serializer 110 may receive data of a certain width n. Serializer 110 may be configured to transmit serialized data of a certain width m. In one embodiment, the length of m may be one bit. The rate of transmitted serialized data may depend upon the ration of n/m and the clock speeds used by serialized 110 and I/O clock 116.

Electronic device 102 may include a transmission driver 112 coupled to serializer 110 and data link 111. Serializer 110 may be configured to pass information after the information has been serialized through a transmission driver 112. Transmission driver 112 may be configured to convert data as it is received from serializer 110 into a form that will be transmitted over data link 111. Such a form may include physical signals.

Transmission driver 112 may use an I/O clock 112 signal to time the transmission of information over data link 111. Such an I/O clock signal 116 may be associated with the clock signals used to time the arrival of incoming data, such as data clock 118, or the frequency at which the data arrives to be input to serializer 110. Serializer 110 may be configured to use a data signal, such as the resulting arriving data itself to be input to serializer 110, I/O clock 112, or data clock 118 to time the generation of serialized data from input data and the transmission of such serialized data.

Electronic device may include a synchronizer 114. In one embodiment, serializer may be configured to use a synchronizer 114 to time the generation of serialized data and the transmission of such serialized data. Synchronizer 114 may be implemented by any suitable component, chip, circuit, or other mechanism. Synchronizer 114 may be configured to receive an input for the clock used by I/O clock 116 and/or serializer 110, and an input for the input data to serializer 110 and/or data clock 118. In one embodiment, synchronizer 114 may be configured to determine, based upon the I/O clock and the input data to serializer 110, configuration information for serializer 110. Such configuration information may include instructions for serializer 110 to synchronize incoming data clock timing from data source 104 and I/O clock 116. Such instructions may include generated code. Serializer 110 may better synchronize the output of data with the serialization of data from data source 104 using such instructions. For example, serializer 110 may be configured to use generated code to synchronize the phases of its use I/O clock 116 and input data to serializer 110.

In one embodiment, synchronizer 114 may be configured to provide configuration information for serializer 110 based upon matching the phases of I/O clock 116 and input data to serializer 110.

Although example embodiments of serializer 110 and synchronizer 114 are shown, serializer 110 and/or synchronizer 114 may include more or less components. Further, in various embodiments serializer 110 and/or synchronizer 114 may not be implemented as a single, unitary device. In such embodiments, various portions of serializer 110 and/or synchronizer 114 may reside in different portions of electronic device 102.

In operation, electronic device 102 may send data from data source 104 to remote device 120 over data link 111. Data from data source 104 may arrive at a particular rate. Such a rate may be given by data clock 118 or by the rate of data being input to serializer 110. Such a rate of data may be included in a data signal including input to serializer 110. Data may be provided to serializer 110, which may divide the data into smaller portions, and send such smaller portions over data link 111 at a rate determined by I/O clock 116. In one embodiment, data may be provided to synchronizer 114, which may determine the phase of the data as it is input to serializer 110. Serializer 110 may send data over data link 111 by accessing transmission driver 112 to translate the data into, for example, physical signals. Serializer 110 may adjust the phase of the data as serializer 110 serializes the data. Serializer 110 may use instructions, such as generated code provided by synchronizer 114, to make such phase adjustments.

Synchronizer 114 may operate in parallel to serializer 110. Synchronizer 114 may use information regarding input data to serializer 110 and the divided clock result of serializer 110 to evaluate the respective phases of such signals. Synchronizer may generate instructions such as a code to instruct serializer 110 on how to adjust its phases of dividing I/O clock 116.

Figure 2:
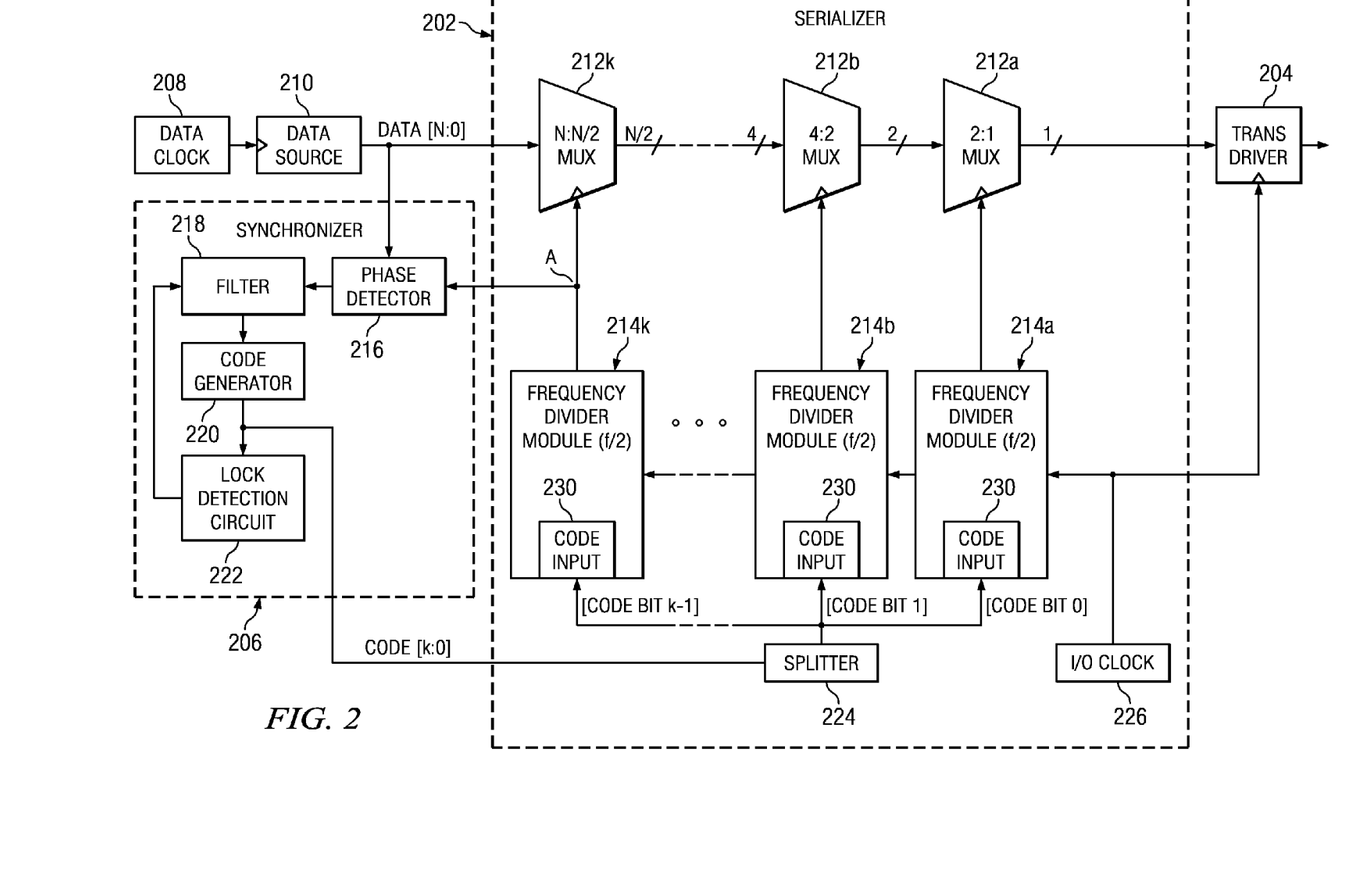
FIG. 2 is a more detailed view of an example embodiment of a portion of a transmission device.

FIG. 2 is a more detailed view of an example embodiment of a portion of a transmission device, such as transmission device 106 of FIG. 1. Synchronizer 206, serializer 202, data clock 208, I/O clock 226, and transmission driver 204 may implement the synchronizer 114, serializer 106, data clock 118, I/O clock 116, and transmission driver 112, respectively, of FIG. 1.

Serializer 202 may implement the serializer 110 of FIG. 1. Serializer 202 may include one or more multiplexers ("MUX") 212. MUX's 212 may be configured to accept a data input of a certain width and, depending upon an input selector, output selected one or more of the data inputs. The output may be of a certain width. The output may be selected (and thus possibly changed) upon receipt of a clock signal. A series of MUX's 212 may be configured to serialize a structure of data into smaller portions. The number of MUX's 212 used in serializer 110 may depend upon the size of input data to serializer 110 and the size of output data of serializer 110. In one embodiment, given an input of N bits to be serialized to a width of one bit, wherein each of MUX's 212 are configured to divide an input in half, the number of required MUX's may be given as $k=\log_2(N)$. For example, if serializer 110 is configured to accept a sixteen-bit input and transmit a one-bit input, then serializer 110 may include ($k=\log_2(16)=4$) MUX's 212. In the example of FIG. 2, serializer 110 may include MUX 212a, configured to multiplex two bits into a single bit; MUX 212b, configured to multiplex four bits into two bits; and so on through MUX 212k, configured to multiplex N bits into N/2 bits.

Each MUX 212 may be communicatively coupled to a clock signal. The clock signal used for each MUX 212 may depend upon the particular serialization function of the MUX 212. The I/O clock 226 may be operating at a particular frequency sufficient to output serialized data through transmission driver 204 at a rate that will equal the amount of data arriving from a data source 210.

Data source 210 may be implemented by an internal data bus or any other suitable mechanism for providing data to serializer 202 to be transported over a data link. Incoming data to serializer 202 may be of a certain size N. Such an N-sized chunk of data may arrive from data source 210 at a rate determined by data clock 208. The frequency of data clock 208 and I/O clock 226 may be synchronized, though not necessarily equal, such that the total amount of data arriving at serializer 202 may equal the total amount of data being transmitted by serializer 202. If serializer 202 is configured to break down N-sized incoming data from data source 210 into smaller M-sized portions, then the frequency of I/O clock 226 may be a multiple of quantity N/M of the frequency of data clock 208.

$$Frequency_{I.Oclock} = Frequency_{DataClock} \times \frac{N(inputwidth)}{M(outputwidth)}$$

In the example of FIG. 2, if serializer 202 is configured to serialize a sixteen-bit input to a one-bit output, then the frequency of I/O clock 226 is sixteen times the frequency of data clock 208.

Accordingly, each MUX 212, as it multiplexes ever-smaller bits into halves, may require operating at twice the frequency as the previous MUX. Thus, serializer 202 may include one or more frequency divider modules 214 to provide an appropriate clock signal for each MUX 212. In one embodiment, serializer 202 may include a frequency divider module 214k for each MUX 212k. Frequency divider module 214 may include any circuit, component, or other suitable mechanism for providing clock signals for one or more MUX's 212. Each frequency divider module 214 may be configured to take a given clock signal, divide the frequency, and output the resulting clock signal to one or more MUX's 212. In the example of FIG. 2, frequency divider modules 214 may be configured to divide the received clock signal in half, starting with a given I/O clock 226, and provide the resulting clocking signal to the corresponding MUX 212. Thus, the frequency of the resulting clock signal after all frequency divider modules 214 have operated at (A) may be equivalent to the data clock 208 frequency, or the frequency at which data arrives from data source 210 to be input to serializer 202.

Serializer 202 may be configured to receive instructions from synchronizer 206 with regard to synchronizing the phase of the clock signals provided to MUX's 212 with the phase associated with the frequency at which data arrives at serializer 202. Such a frequency may be equivalent to the rate of data clock 208. Such instructions may be applied to each frequency divider module 214 to adjust the phase of each such frequency divider module 214. Each such frequency divider module 214 may contain an input for such instructions, such as code input 230. Such instructions may be implemented in a generated code. In one embodiment, such a code may be implemented in a string of length k, equivalent to the number of frequency divider modules 214 used in serializer 202. Each element of such a string may include information for a given frequency divider module 214k, instructing the module about the phase to be included with a resulting clock signal. In one embodiment, such a string may be implemented by a bitstring, indicating whether a given frequency divider module 214k should generate a clock signal with an added phase of 0° or 180°. In the example of FIG. 2, serializer 202 may include a splitter 224 to divide a k-sized generated bit code, wherein bit 0 is provided to frequency divider module 214a, bit 1 is provided to frequency divider module 214b, and so on through bit (k−1) provided to frequency divider module 214k.

Synchronizer 206 may determine instructions for serializer 202 to adjust the phase of clock signals produced by frequency divider modules 214 for use by MUX's 212 by any suitable mechanism. Synchronizer 206 may determine such instructions to adjust the phase of such clock signals to match the phase of the input data to the serializer 210. Synchronizer 206 may be configured to determine such instructions in parallel with the operation of serializer 202. Synchronizer 206 may be configured to determine whether a given frequency divider module 214 should produce a resulting clock signal with an added phase of 0° or 180°, and generate instructions accordingly.

In one embodiment, synchronizer 206 may be configured to implement a delay-locked loop to match the phase of the input data to the serializer 202 with the phase of the I/O clock 226 as it is stepped down to (A). Synchronizer 206 may include a phase detector 216 communicatively coupled to an indication of the input data to the serializer 202 and the resulting clock signal after I/O clock 226 has been stepped down by frequency divider modules 214. Such an indication of the input data may be provided, for example, by routing all or some bits of the input data directly to the synchronizer 206 directly, by monitoring the arrival of data from data source 210 to the serializer 210, or by monitoring a data clock 208. Phase detector 216 may be implemented by any suitable mechanism. Phase detector 216 may be configured to detect the phases of the input data to serializer 202 and the divided clock signal at (A).

Synchronizer 206 may include a filter 218 communicatively coupled to a code generator 220. Phase detector 216 may be communicatively coupled to the filter 218. Filter 218 may be configured to filter the output of phase detector 216 to normalize the information for use by code generator 220.

Code generator 220 may be configured to generate instructions for serializer 202. Code generator 220 may be implemented by a chip, circuit, or other suitable mechanism. Code generator 220 may be configured to compare a phase offset detected by phase detector 216 against previously determined phase offset values. In one embodiment, code generator 220 may contain information regarding a relationship between the code generated and the phase resulting at point (A). Code generator 220 may issue a generated code to synchronizer 202 to advance or retard the phase of the divided clock signal. Code generator 220 may be configured to repeat such actions until the phase offset is minimized. During each such iteration, phase detector 216 may make its calculations upon a stable signal, after instructions generated by code generator 220 have made their impact. Thus, code generator 222 may be coupled to a lock detection circuit 222 configured to freeze the control code upon dithering.

For example, code generator 220 may assume that a predetermined code was used to generate a divided clock signal at (A). Such a predetermined code may be "0000." Code generator 220 may send out a second code tending to advance or decrease the phase of the divided clock signal. Code generator 220 may contain a list of codes in order of increased or decreased resulting phase in the divided clock signal. If the second code was intended to increase the phase, code generator 220 may determine whether the resulting offset was smaller or larger. If the offset was smaller, code generator 220 may issue a third code intended to again increase the phase. If the offset was larger, code generator 220 may issue a third code intended to decrease the phase. The code generator may repeat such steps, wherein a previous decision to increase or decrease the phase is repeated if such a decision resulted in a smaller phase offset, but such a previous increase or decrease is reversed if such a decision resulted in a bigger phase offset.

In operation, data may arrive at serializer 202 from data source 210 at a rate determined by data clock 208. The data may be input to serializer 202 at the rate specified by data clock 208. Serializer 202 may serialize such data by passing the data through a series of MUX's 212. Each MUX 212 may multiplex received data into two pieces. Each MUX 212 may multiplex the two pieces for an equal amount of time. The speed of each MUX 212 may be determined by a corresponding frequency divider module 214. Serializer 202 may pass the data through the series of MUX's 212 until the resulting multiplexed data is, for example, a single bit wide. The data at the end of such multiplexing may be transmitted at a clock rate equal to 2^k (the number of MUX's 212). Such a rate may be equal or approximately equal to the I/O clock 226 frequency. The resulting data may be sent to transmission driver 204.

Serializer 202 may determine the frequency and the phase of each frequency divider module 214. Serializer 202 may step-down the frequency of the I/O clock 226 by passing the I/O clock 226 signal through the frequency divider modules 214. Each such frequency divider module 230 may halve the frequency of the clock signal received. Each frequency divider module 214 may set the phase of the resulting clock signal according to instructions received from synchronizer 206. In one embodiment, each frequency divider module 214 may receive a code bit from splitter 224 indicating whether to generate a clock signal with an added phase of 0° or 180°. The resulting clock signal may be provided to a MUX 212, another frequency divider module 214, or synchronizer 206. The last frequency divider module 214*k* may output its divided clock signal, represented by (A), to synchronizer 206.

In one embodiment, code bits may be provided from code generator 220 to only one frequency divider module 214. Thus, the phase of the resulting divided clock signal may be adjusted only once in the chain of frequency divider modules 214. In a further embodiment, a code bit may be provided to frequency divider module 214*a*.

Synchronizer 206 may operate in parallel with serializer 202. Synchronizer 206 may receive information regarding the arrival of data to be input to serializer 202 and divided clock information resulting from I/O clock 226. Phase detector 216 may compare the phases of the two signals and determine the difference. Such a difference may be filtered through filter 218 and sent to code generator 220. Code generator 220 may analyze the difference in phases detected versus previously determined differences. Code generator 220 may issue a new set of instructions or generated code to be sent to serializer 202 to change the phase of the clock signals used by the multiplexers of serializer 202. Lock detection circuit 222 may hold the looping of the execution of synchronizer until the results of a previously issued code has sufficiently settled for phase detector 216 to evaluate such results.

Figure 3:
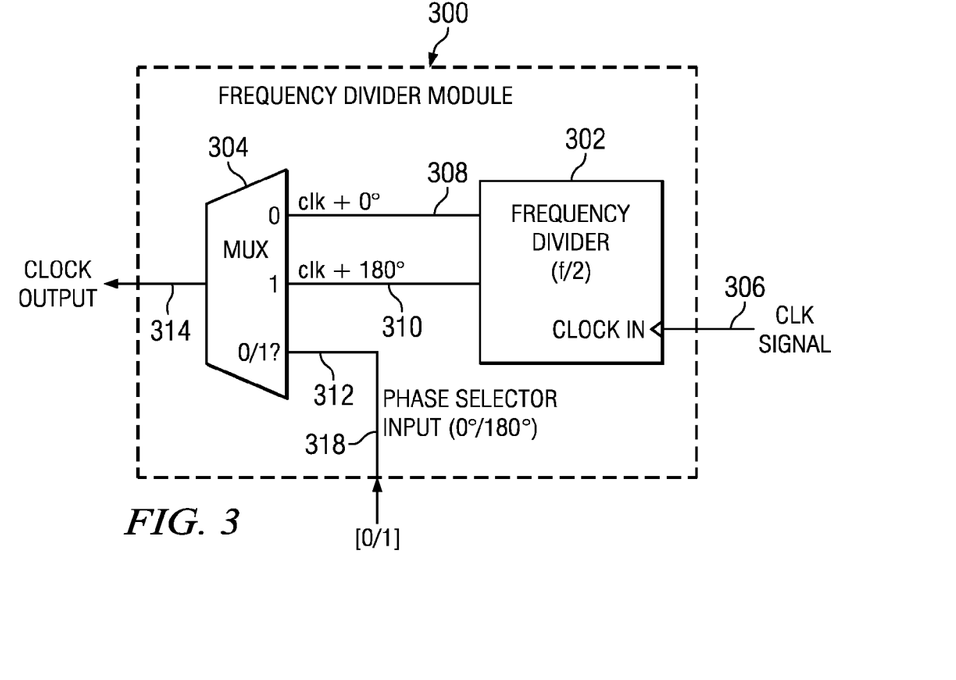
FIG. 3 is an example embodiment of a frequency divider module.

FIG. 3 is an example embodiment of a frequency divider module 300. Frequency divider module 300 may implement the frequency divider module 214 of FIG. 2. Frequency divider module 300 may be configured to accept an input clock signal 306 and provide a resulting clock output 314. Such a clock output 314 may be provided to a corresponding MUX of FIG. 2 and/or to a next frequency divider module, and/or a phase detector. Frequency divider module 300 may be configured to accept a phase selector input 318, instructing the frequency divider module 300 about the phase that is to be associated with the clock output 314. In the example of FIG. 3, the phase selector input 318 may be a bit (0/1) indicating whether a resulting added phase should be 0° or 180°.

Frequency divider module 300 may include a frequency divider 302 coupled to the input clock signal 306 and to a MUX 304. The MUX 304 may be coupled to the phase selector input 318 and the clock output 314. Frequency divider 302 and MUX 304 may be implemented by a circuit, module, chip, or any suitable mechanism.

Frequency divider 302 may be configured to divide clock signal. In the example of FIG. 3, frequency divider 302 may be configured to divide a clock signal frequency in half. Frequency divider 302 may be configured to issue a resulting clock signal with one or more defined phases. For example, frequency divider 302 may be configured to issue a resulting clock signal 308 with an added 0° phase and a resulting clock signal 310 with an added 180° phase. Both resulting clock signals 308, 310 may be output to MUX 304.

MUX 304 may be configured to output either of its inputs (resulting clock signal 308 with a 0° phase; resulting clock signal 310 with an added 180° phase) based upon an input bit. Such an input bit may be coupled to phase selector input 318. For example, if phase selector input 318 is a "0," MUX 304 may be configured to output clock signal 308 with a 0° phase. If phase selector input 318 is a "1," MUX 304 may be configured to output clock signal 310 with an added 180° phase.

Frequency divider module 300 may be configured to provide output signal 314 without glitches during transitions between a 0° phase signal and a 180° phase signal. In one embodiment, to perform such glitchless output operation, frequency divider module 300 may be configured to hold output signal 314 at a "0" or "1" level while transitioning between outputting clock signal 308 or clock signal 310.

In operation, frequency divider module 300 may receive an input clock signal 306 and a phase selector input 318. Frequency divider 302 may divide the frequency of the clock signal in half, and output a clock signal resulting clock signal 308 with a 0° phase and a resulting clock signal 310 with an added 180° phase. Such outputs may be sent to MUX 304. MUX 304 may select the resulting clock signal 308, 310 according to phase selector input 318. Such a selected clock signal may be sent as clock output 314.

Figure 4:
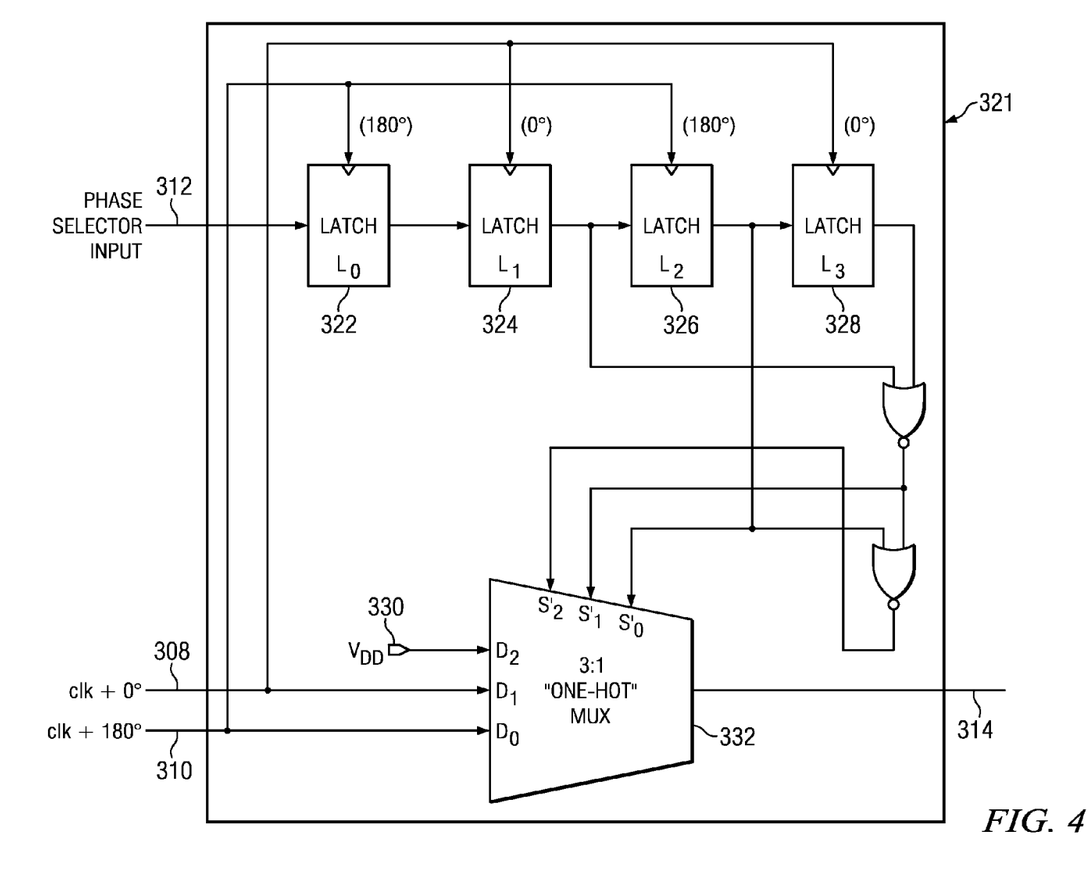
FIG. 4 is an example embodiment of an implementation of a glitchless multiplexer.

FIG. 4 is an example embodiment of an implementation of a glitchless multiplexer 321. Such a multiplexer 321 may implement fully or in part MUX 304 of FIG. 3. Multiplexer 321 may be configured to provide as clock output 314, for example, the received clock signal 308 with zero phase shift difference or the received clock signal 310 with a 180° phase difference, based on phase selector input 312. In one embodiment, upon a change in the selection of the desired output—as detected by a change in phase selector input 312—multiplexer 321 may be configured to delay outputting either clock signal 308, 310 as clock output 314. An instantaneous change from outputting clock signal 308 to clock signal 310, or vice-versa, may cause a glitch in clock output 314. Thus, upon detection of a change in phase selector input 312, instead of instantly outputting the newly selected clock signal multiplexer 321 may be configured to maintain an output value for one or more half-cycles of clock signals. After such a period of time, multiplexer 321 may be configured to output the newly selected clock signal in synchronization with a rise or fall of the newly selected clock signal. The maintained output value may be, for example, a system low voltage indicating a logical "0"—such as ground—or a system high voltage indicating a logical "1"—such as a voltage supply value.

Multiplexer 321 may be implemented in any suitable manner. In the embodiment illustrated in FIG. 4, multiplexer 321 may include one or more latches 322, 324, 326, 328 communicatively coupled together. Latches 322, 324, 326, 328 may be implemented by any suitable device, component, module, analog or digital circuitry. Each of latches 322, 324, 326, and 328 may be configured to maintain a present output value until a rising clock signal is received. At such an instant in time, the latch 322, 324, 326, or 328 may be configured to output the input received at the latch at that instant in time. Latches 322 and 326 may be communicatively coupled to clock signal 310 as a clock signal input. Thus, latches 322 and 326 may be configured to output updated values upon the rising edge of the clock signal shifted by 180° received at multiplexer 321. Latches 324 and 328 may be communicatively coupled to clock signal 308 as a clock signal input. Thus, latches 324 and 328 may be configured to output updated values upon the rising edge of the clock signal shifted by 0° received at multiplexer 321.

Multiplexer 321 may include a 3:1 "one-hot" multiplexer 332. 3:1 "one-hot" multiplexer 332 may be configured to accept possible three inputs—$D_0$, $D_1$, and $D_2$—and multiplex the three lines onto its output, which may be configured to send clock output 314. The selection of which input to multiplex onto the output at any given instance in time may be determined by one or more inputs—$S_0$, $S_1$, and $S_2$. Multiplexer 332 may be configured to determine which of the inputs are equal to logical high voltage or a "1" and multiplex the associated input to the output line. For example, if $S_0$ is set to "1" then the input associated with $D_0$ may be multiplexed to output signal 314. If $S_1$ is set to "1" then the input associated with $D_1$ may be multiplexed to output signal 314. If $S_2$ is set to "1" then the input associated with $D_2$ may be multiplexed to output signal 314. Multiplexer 332 may thus implement a "one-hot" multiplexer configuration.

Clock signal 310 may be communicatively coupled to input $D_0$ on multiplexer 322. Clock signal 308 may be communicatively coupled to input $D_1$ on multiplexer 322. Input $D_2$ of multiplexer 322 may be coupled to a constant voltage level corresponding to a logical value. In one embodiment, input $D_2$ of multiplexer 322 may be connected to $V_{DD}$ 330. $V_{DD}$ may be communicatively coupled to any suitable voltage source. In a further embodiment, input $D_2$ of multiplexer 322 may include a voltage source corresponding to a logical "1" value. In another embodiment, input $D_2$ of multiplexer 322 may include a voltage source corresponding to a logical "0" value. Such a voltage source may be different than logic driving $S_0$, $S_1$, and $S_2$. During a change of values from phase selector input 312, multiplexer 322 may be configured to hold output signal 314 at a level corresponding to input $D_2$ of multiplexer 322 before switching between input $D_1$ and input $D_0$. Multiplexer 322 may be configured to hold such a signal for a time sufficient to effect glitchless operation.

Any suitable logic or connections may be implemented between latches 322, 324, 326, 328 and multiplexer 332 to effect glitchless operation. Such logic or connection may be configured to provide one and only one logical "1" signal at a time to the inputs $S_0$, $S_1$, and $S_2$ of multiplexer 332. Such a logical "1" signal may be configured to signal to multiplexer 332 to output a hold signal, attached to input $D_2$, during a transition between a switch between outputting signals attached to input $D_0$ and $D_1$. The logic or connections may be configured to, in combination with multiplexer 322, delay the change of output signal 314 upon a change in phase selector input 312 until the next high-low or low-high transition of the selected input. The delay may be implemented by, for example, holding the output signal 314 to logical "0" or "1" level for a period of time to affect glitchless transition between outputting clock signal 308 without phase shift and clock signal 310 with 180°. For example, the output of latch 326 may be communicatively coupled to input $S_0$ of multiplexer 332. The output of latch 324 and the output latch of 328 may be communicatively coupled to a NOR gate 334, the output of which may be communicatively coupled to input $S_1$. Further, the output of NOR gate 334 and the output of latch 326 may be communicatively coupled to a NOR gate 336. The output of NOR gate 336 may be communicatively coupled to $S_0$.

In operation, multiplexer 321 may be executing to output clock signal 308 or clock signal 310 on output line 314 based on the input value of phase selector input 312. For example, if phase selector input 312 is "0" then multiplexer 321 may be configured to output clock signal 308, and if phase selector input 312 is "1" then multiplexer 321 may be configured to output clock signal 310. Output clock signal 310 may be routed to latch 322, latch 326, and input $D_0$ of multiplexer 332. Output clock signal 308 may be routed to latch 324, latch 328, and input $D_1$ of multiplexer 332.

In one example, multiplexer 332 may be initially outputting clock signal 310. Phase selector input 312 may be received and be equal to "1." The value "1" may be received at latch 322, latch 324, latch 326, and latch 328. The output of each latch 322, latch 324, latch 326, and latch 328 may be "1." Input $S_0$ of multiplexer 332 may receive a "1" signal from latch 326. Input $S_1$ of multiplexer 332 may receive a "0" from NOR gate 334, which may receive a "1" from latch 328 and a "1" from latch 324. Input $S_2$ of multiplexer 332 may receive a "0" from NOR gate 336, which may receive a "1" from NOR gate 334 and a "1" from latch 326. Thus, multiplexer 336 may output the signal at $D_0$ as indicated by the input at $S_0$.

If phase selector input 312 receives a "0" which indicates an intended change to output clock signal 308 rather than clock signal 310, the received change may be held by latch 322 until a rising edge of clock signal 310 is received. Multiplexer 336 may continue to output the signal at $D_0$ as indicated by the input at $S_0$.

Upon receipt of a rising edge of clock signal 310, latch 322 may send the "0" value to latch 324. Upon a rising edge of clock signal 308, latch 324 may send the "0" value received from latch 322 to latch 326 and NOR gate 334. Clock signal 310 may simultaneously experience a falling edge. NOR gate 334 may continue to issue a "0" as latch 328 may continue sending a "1" to NOR gate 334. Multiplexer 336 may continue to output the signal at $D_0$ as indicated by the input at $S_0$.

Upon receipt of a rising edge of clock signal 310, latch 326 may send the "0" value received from latch 324 to latch 328, NOR gate 336, and input $S_0$. Clock signal 308 may simultaneously experience a falling edge. Multiplexer 336 may cease outputting the input received at $D_0$ as the input at $S_0$ may be "0" from latch 326. NOR gate 334 may issue a "0" and NOR gate 336 may issue a "1" to $S_2$ because the inputs of NOR gate 336, NOR gate 334 and latch 326, have both sent "0" values. Thus, multiplexer 336 may output the signal at $D_2$ as indicated by the input at $S_2$. The signal at $D_2$ may be a logical "1" voltage. Thus, upon such a rising edge of clock signal 310, which was previously output of multiplexer 322, the output may be held high at a logical "1" by $V_{DD}$ 330. The output may thus be held by $V_{DD}$ 330 instead of following either clock signal 308 or clock signal 310.

Upon receipt of a rising edge of clock signal 308, latch 328 may send the "0" value received from latch 326 to NOR gate 334. Clock signal 310 may simultaneously experience a falling edge. However, because multiplexer 336 has selected to send $V_{DD}$ 330 to output line 314, the signal may be held at a logical "1" instead of falling in step with the falling edge of clock signal 310. NOR gate 334 may have as inputs a "0" value from latch 328 and a "0" value from latch 324, and thus send a "1" value to input $S_1$ of multiplexer 332 and to NOR gate 336. NOR gate 336, having received the "1" value, may send a "0" value to input $S_2$ 330. Multiplexer 336 may cease sending $V_{DD}$ 330 as its output and begin sending clock signal 308 to output line 314. Thus, after being held at a logical "1" for a half-cycle, multiplexer 321 may produce clock signal 308 without any glitches in the transition from clock signal 310.

If subsequently phase selector input 312 changed its selection value from a "0" to a "1"—indicating a command to switch from sending clock signal 308 to sending clock signal 310—then the "1" value may arrive at latch 322. Upon a subsequent rising edge of clock signal 310, latch 322 may send the "1" value to latch 324. Multiplexer 336 may continue to send clock signal 308 to output line 314.

Upon a subsequent rising edge of clock signal 308, latch 324 may send the "1" value to latch 326 and to NOR gate 334. NOR gate 334 may send a resulting "0" to input $S_1$ of multiplexer 332 and to NOR gate 336. NOR gate 336 may send a "1" to input $S_2$ of multiplexer 332. Thus, multiplexer 322 may send $V_{DD}$ 330, a logical "1", to output line 314.

Upon a subsequent rising edge of clock signal 310, latch 326 may send the "1" value to latch 328, NOR gate 336, and input $S_0$ on multiplexer 332. NOR gate 336 may send a "0" to input $S_2$ on multiplexer 332. Thus, multiplexer 322 may send clock signal 310, communicatively coupled to line $D_0$ on multiplexer 332, to output line 314. Thus, after being held at a logical "1" for a half-cycle, multiplexer 321 may produce clock signal 310 without any glitches in the transition from clock signal 308.

Figure 5:
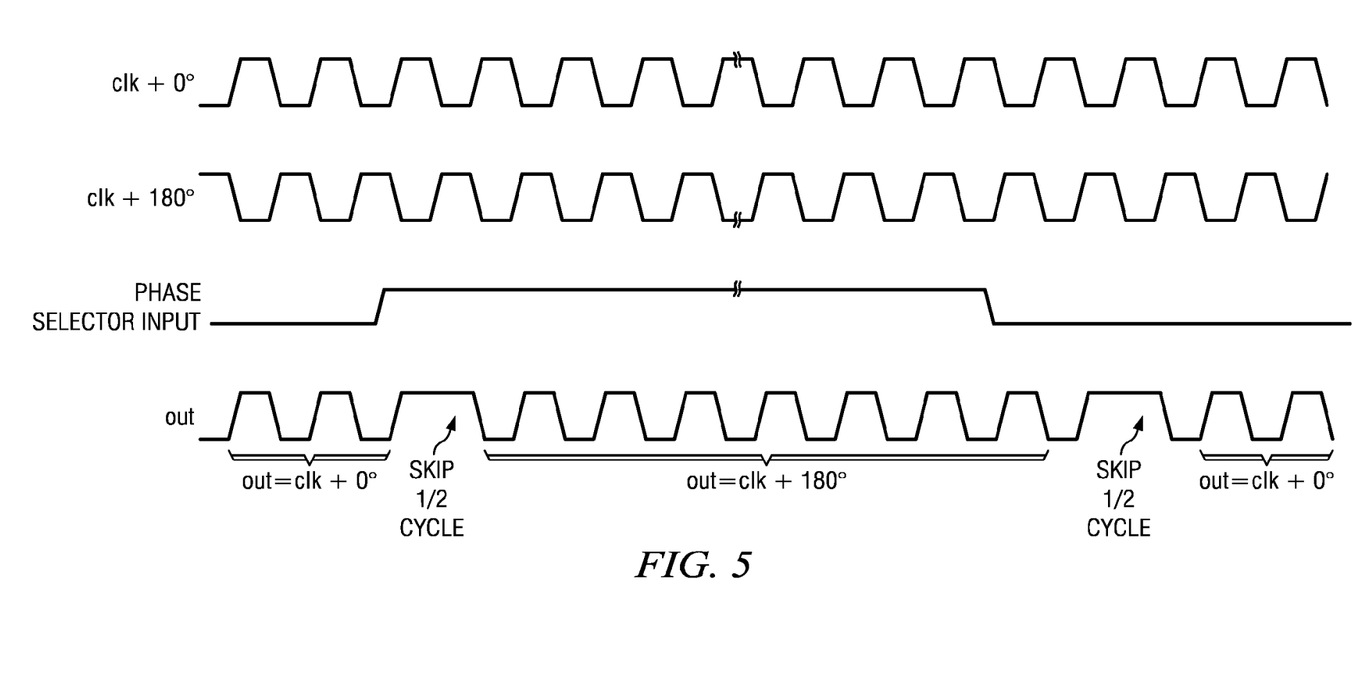
FIG. 5 is a timing diagram of the operation of an example glitchless multiplexer.

FIG. 5 is a timing diagram of the operation of an example glitchless multiplexer such as multiplexer 321 of FIG. 4. FIG. 5 may illustrate sample timing diagram of clock signal 308, which may be the received clock signal without any phase shift, clock signal 310, which may be the received clock signal with a 180° phase shift, phase selector input 312, and associated output line 314.

Initially, phase selector input 313 may be "0" and thus output line 314 may be clock signal 308. Upon receipt of a phase selector input 312 of "1" then output line 314 may be held at a "1" value for a half-cycle of clock signal 308 or clock signal 310. After the termination of the half-cycle, multiplexer 321 may output clock signal 310 as output line 314.

Upon receipt of a phase selector input 312 of "0" then output line 314 may be held at a "1" value for a half-cycle of clock signal 308 or clock signal 310. After the termination of the half-cycle, multiplexer 321 may output clock signal 308 as output line 314.

Figure 6:
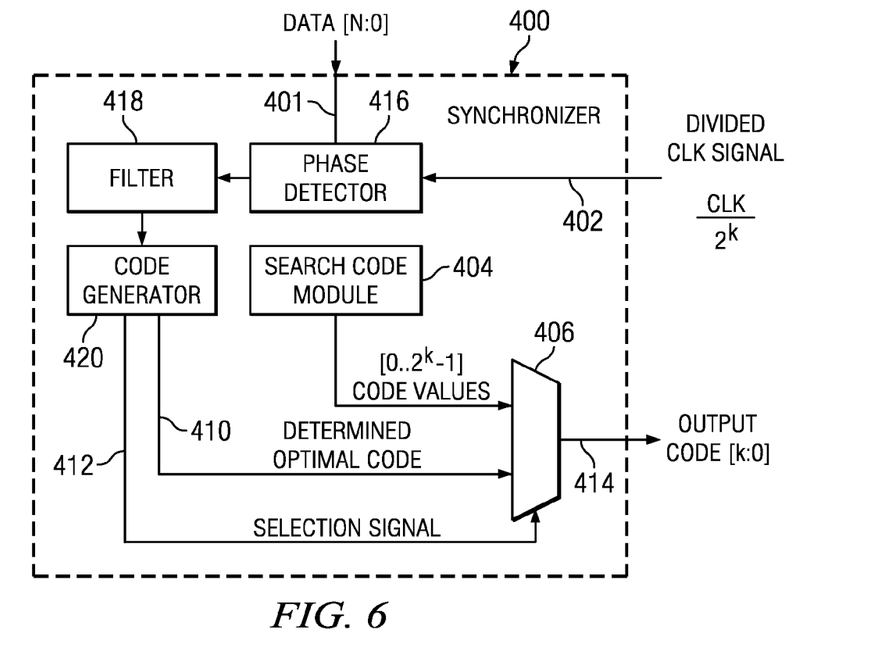
FIG. 6 is an example embodiment of a synchronizer.

FIG. 6 is another example embodiment of a synchronizer 400. Synchronizer 400 may implement the synchronizer 206 of FIG. 2. Synchronizer 400 may comprise a phase detector 416 coupled to a filter 418. Phase detector 416 and filter 418 may be implemented in similar fashion to the phase detector 216 and filter 218 of FIG. 2.

Phase detector 416 may include receive data clock signal 401 and divided clock signal 402. Phase detector may be configured to examine the differences between the phases of the signals and filter the result through filter 420, before sending the determined difference in phases to code generator 420.

Synchronizer 400 may be configured to determine, based upon a received data clock signal 401 and a divided clock signal 402, an instruction such as code 414 to be provided to a serializer. Synchronizer 400 may be configured to conduct a search of possible values for code 414 and to select a code with optimally small phase difference between data clock signal 401 and divided clock signal 402. The search may be conducted in any suitable manner, such as a sweep, a bisection algorithm, or any other type of search.

Synchronizer 400 may include a search code module 404 configured to generate a sweep of possible values for code 414, and a code generator 420 configured to evaluate phase differences in light of previously generated codes 414. The outputs of the search code module 404 and the search code module 420 may be coupled to a MUX 406. Search code module 404 and code generator 420 may be implemented in a circuit, component, chip, or any suitable mechanism.

Search code module 404 may be configured to generate a series of codes. Such a series of codes may reflect a sweep of some or all possible code values. Search code module 404 may output each of such codes to MUX 406 in turn. The possible value of the codes generated may depend upon the serializer used with synchronizer 400, and the width of data to be serialized. For example, for a k-order serializer (a serializer using k MUX's and frequency dividers), there may be $2^k$ possible codes. In one embodiment, search code module 404 may cycle the sweep of possible code values.

Code generator 420 may be configured to determine, for a given code value generated by search code module 404, the corresponding phase difference between the divided clock 402 and the received data as detected by phase detector 416. Code generator 420 may be configured to store the associated phase difference for the given code value and compare it against subsequently detected phases based on different code values. Code generator 420 may be configured to send a selection signal 412 to MUX 406. Such a selection signal 412 may indicate to MUX 406 whether to output the code from search code module 404 or a code from code generator 420. For at least one cycle of the sweep of search code module 404, code generator 420 may be configured to send a selection signal 412 indicating that MUX 406 is to output a code from search code module 404. Code generator 420 may be configured to store the code associated with the smallest phase difference as different codes are issued from search code module 404 during the sweep. For example, during the cycle of the sweep, code generator 420 may be configured to compare the smallest phase difference yet encountered against a phase difference presently detected by phase detector 416. If the present phase is smaller, a previously stored phase and associated code are discarded. The present phase and its associated code are stored as the smallest phase yet encountered.

In one embodiment, after a search of code values as generated by search code module, code generator 420 may be configured determine the code value associated with the smallest, or otherwise optimal, phase offset between the divided clock s402 and the data clock 401. Code generator 420 may be configured to determine that such a code value is the determined optimal code 410. Code generator 420 may be configured to output such a determined optimal code 410 to MUX 406, and to send a selection signal 412 to MUX 406 indicating that the determined optimal code 410 should now be routed as the output code 414.

In another embodiment, the synchronizer may sweep possible code values beginning with a given value and progressing higher or lower. Such a sweep may be stopped as soon as a change in the sign of the phase error is detected. For example, a sweep may go through possible code values, detecting an incrementally changing phase error. The phase error may reach approximately zero and change from positive to negative or from negative to positive. At such a point the sweep may be stopped.

In operation, phase detector 416 may receive signals for data clock 401 and divided clock 402. Phase detector 416 may determine the phase offset between the signals, and send the results through filter 418 to code generator 420.

Code generator 420 may store the phase offset and the code associated with such a divided clock 402. In one embodiment, an initial code for the divided clock 402 may be assumed to be a preset value, such as "0000." Code generator may send a selection signal 412 to MUX 406 indicating that the output of search code module 404 should be routed as the output code 414.

Search code module 404 may generate a first value of a sweep of possible code values, or of code values within a determined range. Search code module 404 may send such a first code to MUX 406. MUX 406 may route the first value as output code 414. Such an output code may be sent to, for example, a serializer.

Code generator may maintain selection signal 412 during the sweep of values by search code module 404. For each value generated by search code module 404, code generator 420 may evaluate whether the phase offset as detected by phase detector 416 is less than the smallest determined phase offset. If so, then code generator 420 may store the new phase offset as the smallest determined phase offset and store the code used to generate the associated divided clock 402.

Upon completion of the sweep, code generator 420 may determine that the smallest phase offset is associated with a code for generating an optimal configuration of the synchronizer and its divided clock 402. Code generator 420 may send the code to MUX 406, and send a selection signal 412 indicating that MUX 406 is to route the determined optimal code 410 to the output code.

Figure 7:
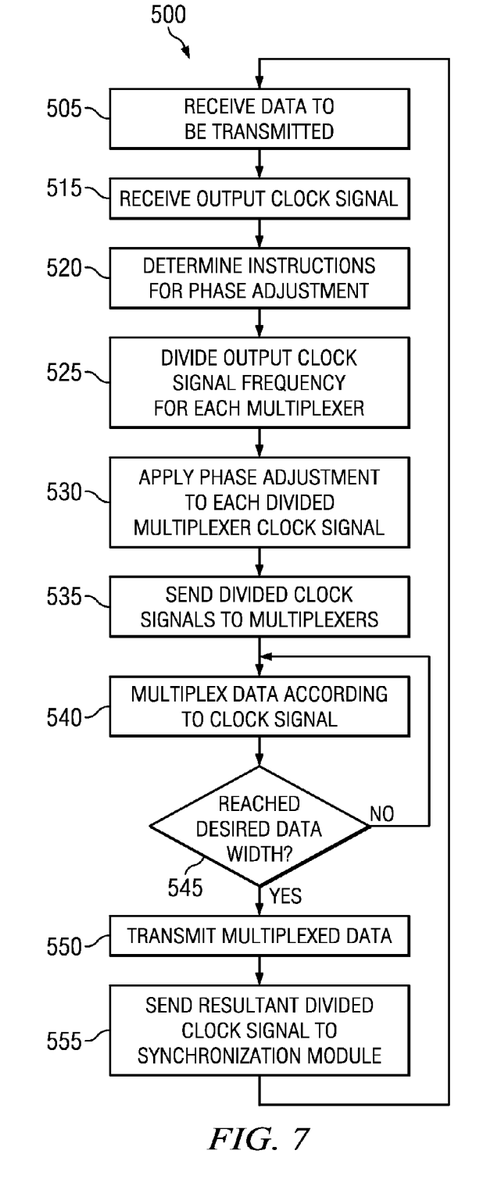
FIG. 7 is an example embodiment of a method for automatic synchronization of input-output transmission.

FIG. 7 is an example embodiment of a method 500 for automatic synchronization of input-output transmission. In step 505, data to be transmitted may be received. In step 515, an output clock signal may be received, determined, or generated. Such an output clock signal may have a frequency that is a multiple of the rate at which data to be transmitted is arriving. The output clock signal frequency may be the rate at which data will be transmitted.

In step 520, instructions for phase adjustment may be received. Such instructions may be in the form of a code, and may be received from a synchronization module. Such instructions may included information on how to adjust the phase of the output clock signal, or divided versions therein, for use during transformation of data to be transmitted. Such transformations may include dividing the output clock signal in step 525. Such divisions may be made for one or more components such as multiplexers.

In step 530, a phase adjustment may be made to each of the divided signals. The result may be a phase-adjusted, divided clock signal for each such component such as a multiplexer. In step 535, each such signal may be sent to the multiplexers.

In step 540, a first multiplexer may multiplex the input data to be transmitted. The multiplexing may be based upon the phase-adjusted, divided clock signal. Such a multiplexing may result in a smaller width of data being multiplexed at a rate twice as fast as the input data was received. In step 545, it may be determined whether a desired data width for transmission has been reached. If not, the multiplexed data may be transmitted downstream to another multiplexer and the method 500 may repeat step 540 for the next multiplexer. If so, then in step 550 the multiplexed data may be transmitted through, for example, a transmission driver.

In step 555, the resultant divided clock signal used for the slowest multiplexer may be transmitted to a synchronization module. The method 500 may repeat the steps 505-555.

Figure 8:
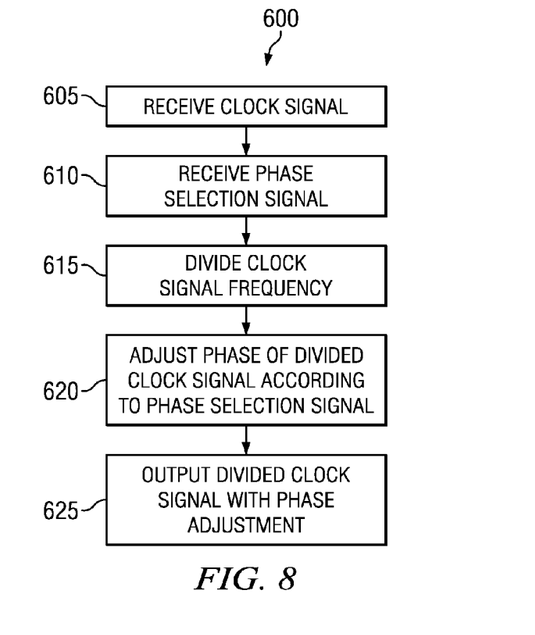
FIG. 8 is an example embodiment of a method for adjusting the phase of a transmission component such as a multiplexer.

FIG. 8 is an example embodiment of a method 600 for adjusting the phase of a transmission component such as a multiplexer. In step 605, a clock signal may be received. Such a clock signal may be received from an I/O clock, or a frequency divider upstream towards such an I/O clock.

In step 610, a phase selection signal may be received. Such a selection signal may be provided as part of instructions from a synchronization module. The selection signal may indicate a degree of phase adjustment which should be performed upon the received clock signal. In one embodiment, the phase adjustment options may include a phase adjustment of 0° or 180°.

In step 615, the received clock signal frequency may be divided. In one embodiment, such a clock signal frequency may be halved.

In step 620, the phase of the divided clock signal may be adjusted according to the phase selection signal. In one embodiment, the division of the clock signal may result in a halved frequency signal with a 0° phase adjustment, and a halved frequency signal with a 180° phase adjustment. In such an embodiment, the phase selection signal may be used to select one of these resultant signals. In another embodiment, the divided clock signal phase may be adjusted by an amount specified or indicated by the phase selection signal.

In step 625, the adjusted clock signal may be output. Such a signal may be sent to, for example, a phase detector, a frequency divider module, or a transmission device component such as a multiplexer.

Figure 9:
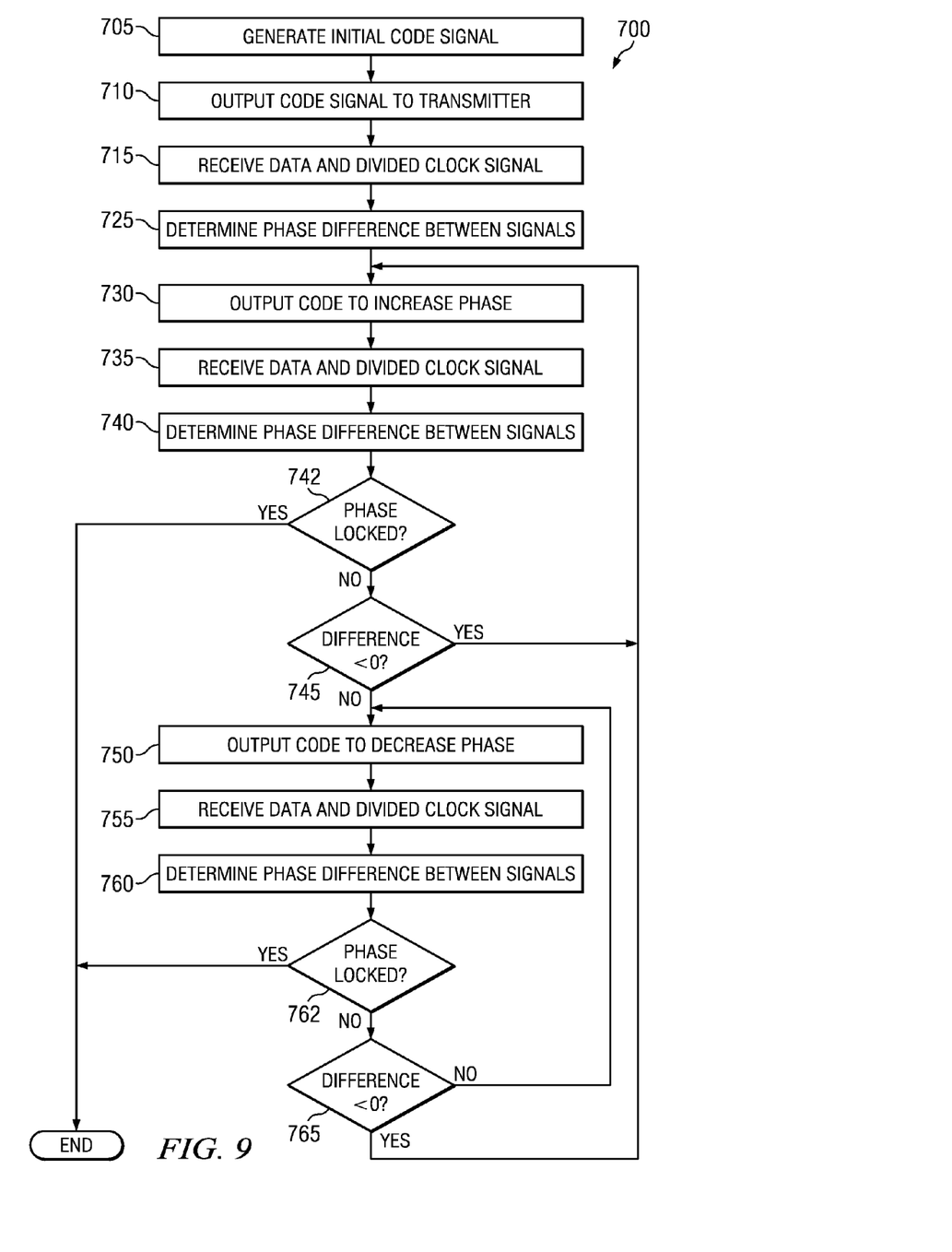
FIG. 9 is an example embodiment of a method for synchronizing the phase of a transmission device with data to be transmitted.

FIG. 9 is an example embodiment of a method 700 for synchronizing the phase of a transmission device with data to be transmitted. In one embodiment, such a method 700 may include performing a delay-locked-loop calculation of instructions for the transmission device to adjust the phase of its transmission clock signal.

In step 705, an initial instruction such as a code may be generated. Such a code may instruct a transmission device on how to adjust the phase of its transmission clock signal. In one embodiment, the code may instruct the transmission device on how to adjust the phase of its clock signals used to transform data for transmission. In step 710, the code may be output to the transmitter.

In step 715, a data clock signal and a divided clock signal resulting from the output code may be received. In one embodiment, the data clock signal may include a clock signal for which data is transmitted or received. In another embodiment, the data clock signal may be determined by the reception of data itself. In step 725, the phase difference between such signals may be determined.

In step 730, a code instructing the transmission device to adjust its phase may be output. The first time step 730 is executed such a code may be associated with increasing or decreasing the phase incrementally. If the issued code is to cause the phase is to be decreased, the method 500 may then execute step 755. In the example of FIG. 9, the issued code may be selected to increase the phase incrementally. In step 735, the data clock signal and divided clock signal resulting from the output code may be received. In step 740, the phase difference between such signals may be determined by comparing the signals.

In step 742, it may be determined whether the phase has locked. Any suitable mechanism or process may be used to determine whether the phase has locked. For example, if the difference between the phases of the data clock signal and divided clock signal are at a value that has been determined to be, or determined to be approximately, a set, convergent value, then the phase may be locked. In another example, if the differences between the phases are less than a threshold amount, then the phase may be locked. In yet another example, if the two signals exhibit dithering among repeated execution of method 700, then the phase may be locked. If the phase is locked, then method 700 may terminate. If the phase is not locked, then method 700 may proceed to step 745.

In step 745, the present phase difference may be compared against the previous phase difference. In one embodiment, if the phase difference has increased, then the method 500 may execute 750, wherein an opposite action will be taken. If the phase difference has decreased, then the method 500 may repeat starting at step 730, wherein a similar action will be repeated. In another embodiment, the present difference between the divided clock and the data clock may be determined to be either positive or negative. A negative difference between the phases, wherein the clock phase is earlier than the data phase, may be used to determine that the clock phase should be increased. A positive difference between the phases, wherein the clock phase is later than the data phase, may be used to determine that the clock phase should be decreased. Consequently, if the difference in phases is less than zero, wherein the clock phase is earlier than the data phase, method 700 may repeat at step 730 to increase the phase. If the difference in phases is greater than zero, method 700 may proceed to step 750 to decrease the phase.

In step 750, a code may be output, wherein application of the code will result in the transmission device decreased its phase incrementally. In step 755, the data clock signal and divided clock signal resulting from the output code may be received. In step 760, the phase difference between such signals may be determined.

In step 762, it may be determined whether the phase has locked. Any suitable mechanism or process may be used to determine whether the phase has locked. For example, if the difference between the phases of the data clock signal and divided clock signal are at a value that has been determined to be, or determined to be approximately, a set, convergent value, then the phase may be locked. In another example, if the differences between the phases are less than a threshold amount, then the phase may be locked. In yet another example, if the two signals exhibit dithering among repeated execution of method 700, then the phase may be locked. If the phase is locked, then method 700 may terminate. If the phase is not locked, then method 700 may proceed to step 765.

In step 765, the present phase difference may be compared against the previous phase difference. In one embodiment, if the phase difference has increased, then the method 500 may execute step 739, wherein an opposite action will be taken. If the phase difference has decreased, then the method 500 may repeat starting at step 750, wherein a similar action will be repeated. In another embodiment, the present difference between the divided clock and the data clock may be determined to be either positive or negative. A negative difference between the phases, wherein the clock phase is earlier than the data phase, may be used to determine that the clock phase should be increased. A positive difference between the phases, wherein the clock phase is later than the data phase, may be used to determine that the clock phase should be decreased. Consequently, if the difference in phases is less than zero, wherein the clock phase is earlier than the data phase, method 700 may repeat at step 730 to increase the phase. If the difference in phases is greater than zero, method 700 may proceed to step 750 to decrease the phase.

Figure 10:
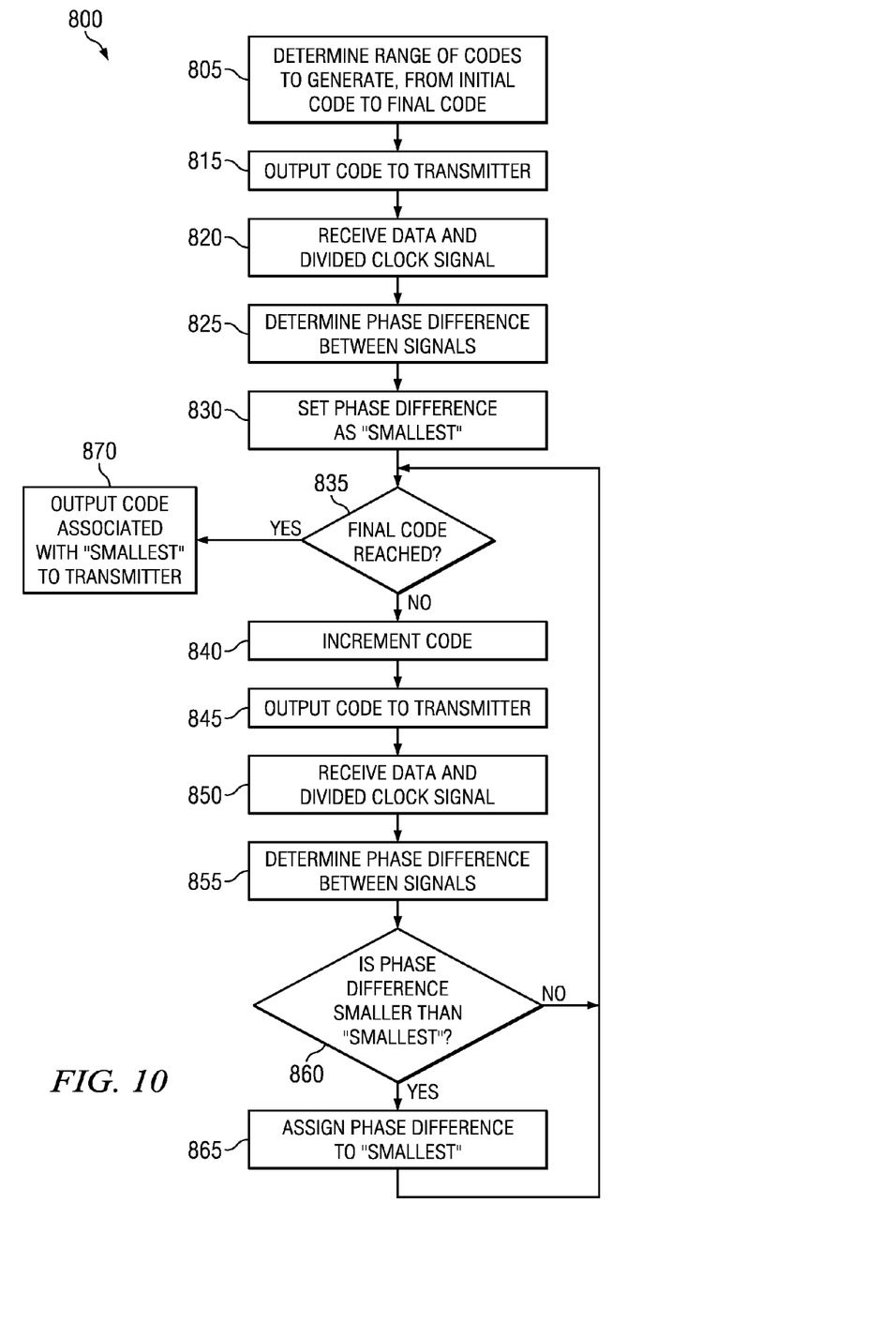
FIG. 10 is another example embodiment of a method for synchronizing the phase of a transmission device with data to be transmitted

FIG. 10 is another example embodiment of a method 800 for synchronizing the phase of a transmission device with data to be transmitted. In one embodiment, such a method 800 may include searching for an optimal set of instructions such as a code to be used by a transmission device to adjust the phase of its transmission clock signal.

In step 805, a range of codes to be evaluated for an optimal code may be determined. Such a range of codes may begin with an initial code and conclude with a final code.

In step 815, the initial code may be generated and output to a transmission device such as a serializer or transmitter. Such a code may be used to adjust the phase of an I/O clock signal for use in transmitting data as the clock signal is divided. In step 820, a data clock signal and a divided clock signal may be received. Such signals may be the result of applying the initial code to the transmission device. In step 825, the phase difference between the signals may be determined. In step 830, the phase difference may be designated as the "smallest."

In step 835, it may be determined whether the final code has been reached. If so, then the method 800 may proceed to step 870. If not, in step 840 the code may be incremented. In one embodiment, such an incrementing may include a simple increase to the value of the code. In another embodiment, such an incrementing may include changing a parameter of the code to a next permutation within the range of codes. By repeating one or more of steps 835-865, a sweep of possible codes may be made.

In step 845, the code may be output to a transmitter for application to adjust the phase of the clock signals used to transform data. In step 850, the data clock signal and divided clock signal may be received. In step 855, the phase difference between the signals may be determined.

In step 860, if the phase difference determined in step 855 is smaller than the phase difference previously assigned to be "smallest," then in step 865 the phase difference determined in step 855 is assigned to be "smallest." If not, then the method 500 may return to step 835.

In step 870, the phase difference assigned to be "smallest" may be determined to be the smallest phase difference encountered during the sweep of code values. The code associated with such a phase difference may be determined to be an optimal code value within the range considered. Such a code may be output to the transmitter.

Although FIGS. 7-10 discloses a particular number of steps to be taken with respect to examples methods 500, 600, 700, 800, methods 400, 500, 600, 700, 800 may be executed with more or fewer steps than those depicted in FIGS. 7-10. In addition, although FIGS. 7-10 discloses a certain order of steps to be taken with respect to methods 500, 600, 700, 800, the steps comprising methods 500, 600, 700, 800 may be completed in any suitable order.

Methods 500, 600, 700, 800 may be implemented using the system of FIGS. 1-6 or any other system, network, or device operable to implement methods 500, 600, 700, 800. In certain embodiments, methods 500, 600, 700, 800 may be implemented partially or fully in software embodied in computer-readable media.

For the purposes of this disclosure, computer-readable media may include any instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory; as well as non-transitory media; and/or any combination of the foregoing.

Although the present disclosure has been described in detail, it should be understood that various changes, substitutions, and alterations can be made hereto without departing from the spirit and the scope of the disclosure as defined by the appended claims. For example, although output operations have been described, input operations may be conducted by equivalent mechanisms and methods.

What is claimed is:

1. An electronic device, comprising:
a transmitter communicatively coupled to a synchronizer circuit;
the synchronizer circuit including:
a code generator circuit; and
a lock detection circuit;
wherein:
the transmitter is configured to:
transform received data for transmission;
receive a first instruction from the synchronizer circuit;

adjust the phase of a clock signal used to time the transformation of the received data based on the first instruction;
send the adjusted clock signal to the synchronizer circuit;
the synchronizer circuit is configured to:
receive the adjusted clock signal;
receive a data signal comprising a frequency and a phase of data to be transmitted;
determine a second instruction for the transmitter based on the adjusted clock signal and the data signal, wherein the second instruction includes a code configured to individually instruct two or more components of the transmitter on whether to adjust the phase of a clock signal; and
provide the second instruction to the transmitter;
the code generator circuit is configured to:
associate a phase adjustment with the code;
the lock detection circuit is configured to:
determine whether the inputs to the code generator circuit are stable;
allow generation of new codes when the inputs are determined to be stable; and
disable generation of new codes when the inputs are determined to be unstable.

2. The electronic device of claim 1, wherein the synchronizer circuit comprises a delay-locked loop.

3. The electronic device of claim 1, wherein the synchronizer circuit further comprises a phase detector circuit communicatively coupled to the adjusted clock signal and the data signal, the phase detector circuit configured to determine a phase difference between the adjusted clock signal and the data signal.

4. The electronic device of claim 3, wherein the synchronizer circuit is further configured to:
determine the difference between the phase of the adjusted clock signal and the data signal;
determine whether the phase of the adjusted clock signal is ahead of the phase of the data signal;
determine a third instruction configured to:
decrease the phase of the adjusted clock signal when the adjusted clock signal phase is greater than the data signal phase; and
increase the phase of the adjusted clock signal when the adjusted clock signal phase is less than the data signal phase.

5. The electronic device of claim 3, wherein configuring the synchronizer circuit to determine a second instruction for the transmitter comprises configuring the synchronizer circuit to:
select a range of candidate instructions;
for each candidate instruction in the range:
provide the candidate instruction to the transmitter;
receive the adjusted clock signal and the data signal;
determine the phase difference between the adjusted clock signal and the data signal;
determine which candidate instruction yielded the phase difference of the lowest magnitude; and
select such a candidate instruction yielding the lowest phase difference as the second instruction.

6. The electronic device of claim 1, wherein the code instructs the components of the transmitter whether to adjust the phase of the clock signal by 180°.

7. The electronic device of claim 1, wherein the code is configured to individually instruct two or more frequency dividers to adjust the phase of their output.

8. The electronic device of claim 1, wherein the transmitter comprises:
one or more multiplexers configured to multiplex an input data portion into a plurality of smaller subportions for transmission;
one or more frequency dividers configured to divide an output clock frequency to provide each of the multiplexers with a multiplexer clock signal;
wherein each of the frequency dividers adjust the phase of the multiplexer clock signal based upon the received first instruction.

9. A method of synchronizing the transmitting of data, comprising:
receiving a divided clock signal;
receiving a data signal comprising a frequency and a phase of data to be transmitted;
determine an instruction for a transmitter based on the divided clock signal and the data signal, the instruction including information associated with adjusting the phase of the divided clock signal, the divided clock signal configured to time transformation of data, includes a code configured to individually instruct two or more components of the transmitter on whether to adjust the phase of a clock signal;
associating a phase adjustment with the code;
providing the instruction to the transmitter;
determining whether inputs for code generation are stable;
allowing generation of new codes when the inputs are determined to be stable; and
disabling generation of new codes when the inputs are determined to be unstable.

10. The method of claim 9, further comprising determining a phase difference between the divided clock signal and the data signal.

11. The method of claim 9, further comprising:
determining the difference between the phase of the adjusted clock signal and the data signal;
determining whether the phase of the adjusted clock signal is ahead of the phase of the data signal;
determining a subsequent instruction configured to:
decrease the phase of the adjusted clock signal when the adjusted clock signal phase is greater than the data signal phase; and
increase the phase of the adjusted clock signal when the adjusted clock signal phase is less than the data signal phase.

12. The method of claim 9, wherein determining an instruction for the transmitter comprises:
selecting a range of candidate instructions;
for each candidate instruction in the range:
providing the candidate instruction to the transmitter;
receiving the divided clock signal and the data signal;
determining the phase difference between the divided clock signal and the data signal;
determining which candidate instruction yielded the phase difference of the lowest magnitude; and
selecting a candidate instruction yielding the lowest phase difference as the determined instruction.

13. The method of claim 9, wherein the code instructs the components of the transmitter whether to adjust the phase of the clock signal by 180°.

14. The method of claim 9, wherein the code is configured to individually instruct two or more frequency dividers to adjust the phase of their output.

15. A system, comprising:
a transmitter communicatively coupled to a synchronizer circuit;

the synchronizer circuit including:
  a code generator circuit; and
  a lock detection circuit;
wherein:
  the transmitter is configured to:
    transform received data for transmission;
    receive a first instruction from the synchronizer circuit;
    adjust the phase of a clock signal used to time the transformation of the received data based on the first instruction;
    send the adjusted clock signal to the synchronizer circuit;
  the synchronizer circuit is configured to:
    receive the adjusted clock signal;
    receive a data signal comprising a frequency and a phase of data to be transmitted;
    determine a second instruction for the transmitter based on the adjusted clock signal and the data signal, wherein the second instruction includes a code configured to individually instruct two or more components of the transmitter on whether to adjust the phase of a clock signal; and
    provide the second instruction to the transmitter;
  the code generator circuit is configured to:
    associate a phase adjustment with the code;
  the lock detection circuit is configured to:
    determine whether the inputs to the code generator circuit are stable;
    allow generation of new codes when the inputs are determined to be stable; and
    disable generation of new codes when the inputs are determined to be unstable.

16. The system of claim 15, wherein the synchronizer circuit comprises a delay-locked loop.

17. The system of claim 15, wherein the synchronizer circuit further comprises a phase detector circuit communicatively coupled to the adjusted clock signal and the data signal, the phase detector circuit configured to determine a phase difference between the adjusted clock signal and the data signal.

18. The system of claim 17, wherein the synchronizer circuit is further configured to:
  determine the difference between the phase of the adjusted clock signal and the data signal;
  determine whether the phase of the adjusted clock signal is ahead of the phase of the data signal;
  determine a third instruction configured to:
    decrease the phase of the adjusted clock signal when the adjusted clock signal phase is greater than the data signal phase; and
    increase the phase of the adjusted clock signal when the adjusted clock signal phase is less than the data signal phase.

19. The system of claim 17, wherein configuring the synchronizer circuit to determine a second instruction for the transmitter comprises configuring the synchronizer circuit to:
  select a range of candidate instructions;
  for each candidate instruction in the range:
    provide the candidate instruction to the transmitter;
    receive the adjusted clock signal and the data signal;
    determine the phase difference between the adjusted clock signal and the data signal;
  determine which candidate instruction yielded the phase difference of the lowest magnitude; and
  select such a candidate instruction yielding the lowest phase difference as the second instruction.

20. The system of claim 15, wherein the code instructs the components of the transmitter whether to adjust the phase of the clock signal by 180°.

21. The system of claim 15, wherein the code is configured to individually instruct two or more frequency dividers to adjust the phase of their output.

22. The system of claim 15, wherein the transmitter comprises:
  one or more multiplexers configured to multiplex an input data portion into a plurality of smaller subportions for transmission;
  one or more frequency dividers configured to divide an output clock frequency to provide each of the multiplexers with a multiplexer clock signal;
  wherein each of the frequency dividers adjust the phase of the multiplexer clock signal based upon the received first instruction.

* * * * *